(12) United States Patent
Hughes

(10) Patent No.: US 6,867,444 B1
(45) Date of Patent: Mar. 15, 2005

(54) SEMICONDUCTOR SUBSTRATE INCORPORATING A NEUTRON CONVERSION LAYER

(75) Inventor: Harold L. Hughes, West River, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/693,846

(22) Filed: Oct. 20, 2003

(51) Int. Cl.$^7$ ................................................ H01L 29/84
(52) U.S. Cl. ........................................ 257/252; 438/48
(58) Field of Search ........................... 257/252; 438/48, 438/49, 51

(56) References Cited

U.S. PATENT DOCUMENTS 6,075,261 A     6/2000   Hossain et al.

OTHER PUBLICATIONS

McGregor et al, "Self–Biased Boron–10 Coated High–Purity Epitaxial GaAs Thermal Neutron Detector" IEEE transactions on nuclear science, vol. 47, No., Aug. 2000.
McGregor et al, "Recent Results From Thin–Film Coated Semiconductor Neutron Detectors" X–Ray and Gamma––Ray Detector and Application IV, vol. 4784 (2002).
Haque et al, "Neutron dosimetry employing soft errors in dynamic random access memories" Phys. Med. Biol., 1989 vol. 34, No. 9, 1195–1202 Printed in the UK.

Phillips et al, "Feasibility of a Neutron Detector–Dosemeter Based on Single–Event Upsets in Dynamic Random–Access Memories" Radiation Protection Dosimetry vol. 101, Nos. 1–4, pp. 129–132 (2002) Nuclear Technology Publishing.

(List continued on next page.)

*Primary Examiner*—Eddie Lee
*Assistant Examiner*—Douglas W. Owens
(74) *Attorney, Agent, or Firm*—John J. Karasek; Stephen T. Hunnius

(57) ABSTRACT

A semiconductor substrate incorporating a neutron conversion layer (such as boron-10) that is sensitive enough to permit the counting of single neutron events. The substrate includes an active semiconductor device layer, a base substrate, an insulating layer provided between the active semiconductor device layer and the base substrate, and a neutron conversion layer provided between the active semiconductor device layer and the base substrate. The neutron conversion layer is located within the insulating layer, between the insulating layer and the base substrate or between the active semiconductive device layer and the insulating layer. A barrier layer is provided between at least one of the neutron conversion layer and the active semiconductor device layer and the neutron conversion layer and the base substrate to prevent diffusion of the neutron conversion material provided in the neutron conversion layer. Further, a plurality of trenches may be formed in the active semiconductor device layer. In such a case, a trench neutron conversion layer is formed in at least one of the trenches to improve device sensitivity.

20 Claims, 5 Drawing Sheets

OTHER PUBLICATIONS

Robertson et al, "A class of boron–rich solid–state neutron detectors" Applied Physics Letters vol. 80, No. 19, May 13, 2002.

Guarini et al, "Electrical Integrity of State–of–the–Art 0.13 μm SOI CMOS Devices and Circuits Transferred for Three–Dimensional (3D) Integrated Circuit (IC) Fabrication" 0–7803–7462–2/02 2002 IEEE.

Arita et al, "Experimental Investigation of Thermal Neutron–Induced Single Event Upset in Static Random Access Memories" Jpn. J. Appl. Phys vol. 40 (2001) pp. L151–L153 Part 2, No. 2B, Feb. 15, 2001.

Hughes et al, "Radiation Effects and Hardening of Mos Technology: Devices and Circuits" Preprint IEEE Trans. Nucl. Sci. Jun. 2003.

Lund et al. "Neutron Dosimeter Using a Dynamic Random Access Memory as a Sensor" IEEE *Transactions on Nuclear Science,* vol. 33, No. 1, Feb. 1996.

Petersen et al. "Calculation of Cosmic–Ray Induced Soft Upsets and Scaling in VLSI Devices*" IEEE Transaction on Nuclear Science, vol. NS–29, No. 6, Dec. 1982.

Davis "Use of Computer–Memory Chips as The Basis For a Digital Albedo Neutron Dosimeter*" Health Physics vol. 49, No. 2 (Aug.), pp. 259–265, 1985 Printed in the U.S.A.

SEMICONDUCTOR SUBSTRATE INCORPORATING A NEUTRON CONVERSION LAYER

BACKGROUND OF THE INVENTION

The present invention is directed in general to semiconductor substrates. The present invention is specifically directed to a semiconductor substrate that includes a neutron conversion layer capable of being utilized for the detection of neutrons. A neutron detection device fabricated in the substrate can be one of many different types including: simple junctions (meta/oxide/metal or p/n junction type), charge-coupled devices (CCDs), and metal-oxide-semiconductor (MOS) integrated circuits.

The development of nuclear weapons gave rise to several urgent applications for highly sensitive neutron detectors. The applications include safeguarding nuclear materials and weapons, treaty verification, anti-proliferation, and the recovery of lost military payloads. More recently, however, the need to guard against nuclear smuggling, the potential of a radiological weapon (so called "dirty" bombs), and terrorist acts, has given rise to an urgent need to perform neutron surveillance at border and port facilities, transportation systems and other places where large amounts of cargo or people passes by or through on a regular basis. Such neutron surveillance must be accomplished without undue restriction or disruption of traffic flow and events.

Conventional neutron detectors have been based on the phenomenon of scintillation, which is a result of electronic transitions that occur in the wake of energetic charged nuclei being released from reactions between incident neutrons and an irradiated atomic nuclei. Scintillation devices include a neutron sensitive material (either a gas or a liquid) that generates charged particles upon receipt of incident neutrons. Typically, gaseous helium-3 contained in glass tubes has been utilized in conventional scintillation devices. The scintillation devices are typically coupled to a photomultiplier tube to generate an analog electrical signal based on the production of the charged particles within the glass tubes. These types of conventional neutron detectors are bulky and not well suited for use in field operations requiring compact and highly sensitive devices. In particular, the helium-3 filled tubes are delicate, require careful handling, and can indicate false positives when abruptly moved or struck.

With the advent of solid state electronics, it was realized silicon-based semiconductor devices could be used as detectors for detecting alpha particles resulting from an (n, alpha) reaction with a neutron converter material. Initial demonstrations of such a concept used free standing converter foils placed near a silicon detector such as a PIN diode. It is more common now to utilize films of converter material placed in contact with or deposited directly upon semiconductor detectors. Lithium metal has been used for this purpose, although the chemical reactivity of the lithium metal tends to lead to shorter detector life. Greater life has been obtained with compounds of lithium such as LiF, a hard crystalline material. Boron metal has also been applied directly to silicon devices. See, "Recent Results From Thin-Film-Coated Semiconductor Neutron Detectors", D S. McGregor et al., X-Ray and Gamma-Ray Detectors and Applications IV, Proceedings of SPIE, Vol. 4784 (2002), the contents of which are incorporated herein by reference.

The use of diode structures, however, in neutron detectors has its own set of drawbacks and limitations. The internal noise level of an uncooled diode is appreciable, and consequently it is difficult, if not impossible, to measure low background levels of ambient thermal neutrons in the surrounding area. A typical diode also has a thick semiconductor layer in which charges are collected, and is not sensitive enough to detect single neutron events. Charges liberated by gamma rays are also collected in the thick semiconductor layer and these charges contribute to the non-neutron noise signal of the detector.

More recently, it has been proposed that a previously considered disadvantage of semiconductor memory cells be turned into an advantage with respect to neutron detection. Memory cells have traditionally been "hardened" against radiation to prevent errors induced by radiation. In fact, the importance of such memory integrity has been readily appreciated for many years in the field of computers, aviation and space flight. A radiation-induced bit error is known as a soft error if the affected memory cell subsequently responds to write commands. In contrast, the induced bit error is known as a hard error if subsequent attempts to change the state of the memory cell are ineffective. Both hard and soft errors are known as single event upsets (SEUs) or single event errors (SEEs) provided that a single incoming particle induces the error in the memory cell. The error events, which are detrimental when trying to maintain data integrity, can be used in a positive manner to detect radiation events by simply monitoring the states of the memory cells.

Attempts have been made to utilize commercial memory circuits with a neutron converter in order to use the SEU associated with the memory circuits for neutron detection. For example, boron has been used in the semiconductor industry as a dopant and in boron containing glass as a passivation layer that is used to encapsulate a finished semiconductor chip. It has been demonstrated that $^{10}B$ in the dopant or borophophosilicate glass (BSPG) passivation layer is responsible for sensitizing a circuit to neutron radiation. See, "Experimental Investigation of Thermal Neutron-Induced Single Event Upset in Static Random Access Memories", Y. Arita et al., Jpn. J. Appl. Phys. 40 (2001) pp L151–153, the contents of which are incorporated herein by reference. Accordingly, proposals have been made to coat boron on a conventional passivated semiconductor memory chip or to mill off the passivation first and then coat the chip with a boron converter layer. U.S. Pat. No. 6,075,261 issued to Houssain et al. and entitled "Neutron Detecting Semiconductor Device", the contents of which are incorporated herein by reference, discloses one such attempt at utilizing a conventional semiconductor memory structure as a neutron detector, wherein a neutron-reactant material is coated over a conventional flash memory device. These efforts to date, however, have resulted in insensitive detectors primarily because the boron conversion material is not located close enough to the active device layer due to thick overlayers used for interconnection and electrical isolation. Thus, alpha particles and lithium ions generated by the boron conversion material cannot generate a sufficient charge in the active device layer to cause an SEU.

In view of the above, it would be desirable to provide a semiconductor substrate that internally incorporates a neutron conversion layer, which could be utilized for the production of a neutron detection device that does not require the use of fragile tubes or high voltages, is not sensitive to gamma radiations, is not sensitive to thermal noise, but yet is sensitive enough to permit the counting of single neutron events.

SUMMARY OF THE INVENTION

The invention provides a semiconductor substrate that incorporates a neutron conversion layer (such as boron-10), which can be utilized for the production of a neutron detection device that does not require the use of fragile tubes or high voltages, is not sensitive to gamma radiations, is not sensitive to thermal noise, but yet is sensitive enough to permit the counting of single neutron events.

Specifically, a semiconductor substrate is provided that includes an active semiconductor device layer (into which devices and circuits are built), a base substrate, an insulating layer provided between the active semiconductor device layer and the base substrate, and a neutron conversion layer provided between the active semiconductor device layer and the base substrate. The neutron conversion layer is located within the insulating layer, between the insulating layer and the base substrate or between the active semiconductive device layer and the insulating layer.

A barrier layer is preferably provided between at least one of the neutron conversion layer and the active semiconductor device layer and the neutron conversion layer and the base substrate to prevent diffusion of the neutron conversion material provided in the neutron conversion layer.

Further, a plurality of trenches may be formed in the active semiconductor device layer to create isolation regions. In such a case, a trench neutron conversion layer may be formed in at least one of the trenches to improve device sensitivity.

In the illustrated embodiments, the neutron conversion layer includes boron-10, which reacts with neutrons to form alpha particles and lithium ions that react with electronic device elements located in the active semiconductor device layer.

Additional details and advantages of the invention will become apparent to those skilled in the art in view of the following detailed description of the preferred embodiments of the invention.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

Figure 1:
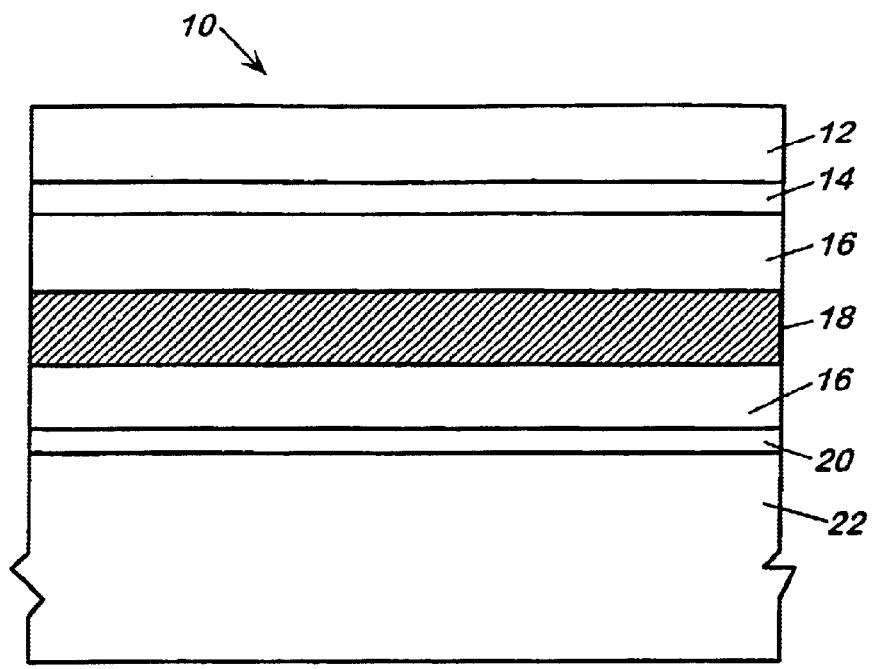
FIG. 1 illustrates a neutron sensitive SOI substrate in accordance with a first embodiment of the invention.

This application hereby incorporates by reference the application entitled "Neutron Detection Device and Method of Manufacture", assigned NC 84,355, filed on date even herewith. FIG. 1 illustrates a neutron sensitive SOI substrate 10 in accordance with a preferred embodiment of the invention. As shown in FIG. 1, the neutron sensitive SOI substrate 10 includes an active semiconductor (silicon) device layer 12, a top barrier layer 14, an insulating layer 16, a neutron conversion layer 18, a bottom barrier layer 20 and a base (silicon) substrate 22. As will be readily understood with reference to conventional SOI architecture, electronic circuits and circuit elements (including memory cells) are formed in the active semiconductor device layer 12, which may generally range from 10 to 1000 nm in thickness. The insulating layer 16, for example silicon dioxide, constitutes a buried oxide (BOX) that electrically isolates the active semiconductor layer 12 from the base silicon substrate 22. The present neutron sensitive SOI substrate differs from conventional SOI substrates in that a the neutron conversion layer 18 is provided between the active semiconductor device layer 12 and the base silicon substrate 22.

As shown in FIG. 1, the neutron conversion layer 18 is actually located within the silicon dioxide layer 18. The neutron conversion layer 18 preferably includes boron-10 and has a thickness generally from 500 to 5000 nm. The boron-10 reacts with neutrons to generate alpha particles and lithium ions that cause electrical effects in electronic circuits and circuit elements. The top barrier layer 14 and the bottom barrier layer 20, preferably silicon nitride in the illustrated example, are provided to prevent the boron-10 in the neutron conversion layer 18 from diffusing into the active semiconductor device layer 12 and the base silicon substrate 22. Those skilled in the art will appreciate that the location of the neutron conversion layer 18 in close proximity to the active semiconductor device layer 12 (this meaning in direct contact with the active semiconductor device layer 12 or separated by it by an insulating layer or barrier layer) makes it possible to produce highly sensitive neutron detectors by forming memory cells within the active semiconductor device layer 12, as the alpha particles generated by the neutron conversion layer 18 are well within the range of the active semiconductor device layer 12 and can produce sufficient energy to cause a SEU in memory cells formed therein.

The neutron sensitive SOI substrate 10 is fabricated by utilizing modifications of conventional SOI fabrication techniques. The process begins with two silicon wafers on which the barrier layers 14, 20 are preferably formed. Oxide layers are then formed on the barrier layers 14, 18. The neutron conversion layer 18 is then formed by depositing a neutron conversion material (for example a borosilicate glass film containing boron-10) on one or both of the oxide layers. Alternatively, the neutron conversion material (for example boron-10) is implanted or diffused into the oxide layers. The two silicon wafers are then bonded together such that the neutron conversion layer 18 is located in the center of the combined substrate structure, and sandwiched between the oxide layers which constitute the insulating layer 16. One of the silicon wafers acts as a handle wafer and therefore includes the base silicon substrate 22. The other silicon wafer is thinned to form the active semiconductor device layer 12.

Figure 2:
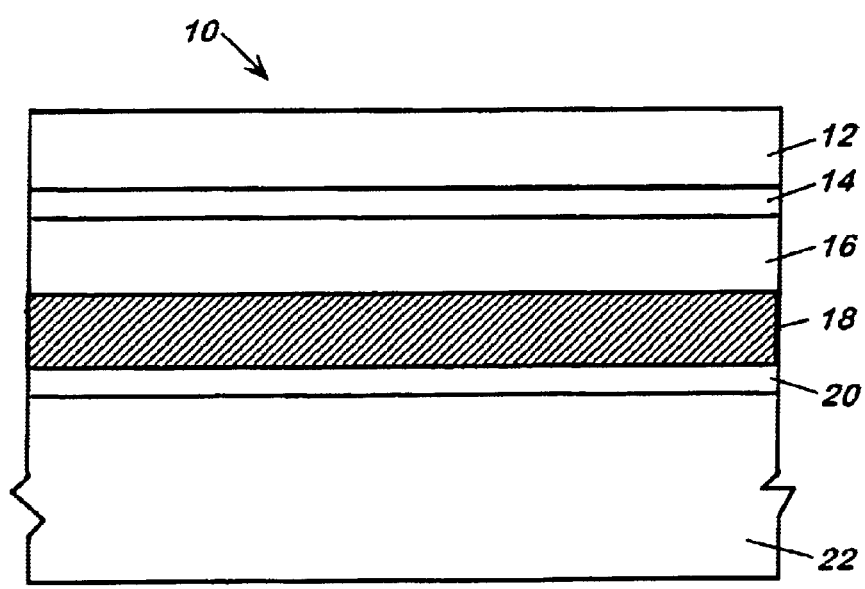
FIG. 2 illustrates an embodiment of the invention in which the neutron conversion layer is provided beneath the insulating layer.
Figure 3:
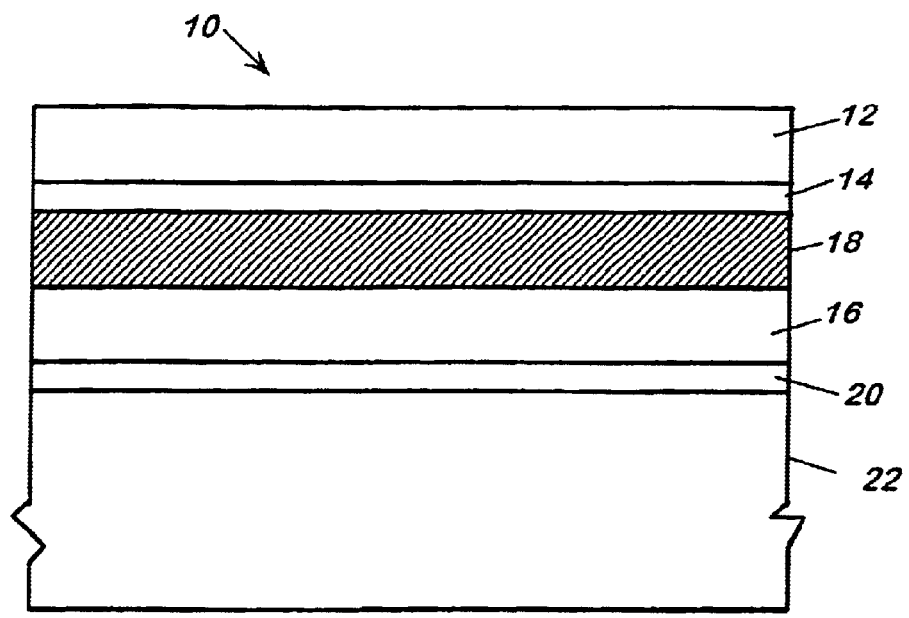
FIG. 3 illustrates an embodiment of the invention in which the neutron conversion layer is provided on top of the insulating layer.

It will be understood that modifications of the basic structure are readily possible, as long as the neutron conversion layer 18 remains in close proximity to the active silicon layer 12. FIG. 2, for example, illustrates an embodiment in which the neutron conversion layer 18 is provided beneath the insulating layer 16. In this embodiment, a boron-10 enriched film is deposited on a handle wafer in a conventional SOI manufacturing process. A second wafer, on which an oxidation layer is formed, is then bonded to the handle wafer. The second wafer is then thinned to form the active semiconductor device layer 12. Similarly, FIG. 3 illustrates a further embodiment in which the neutron conversion layer 18 is provided on top of the insulating layer 16. The specific substrate chosen for a given application will depend on the type of active device provided in the active semiconductor device layer 12, the type of neutron conversion material employed, and the relative thicknesses of the layers required in the device structure.

Figure 4:
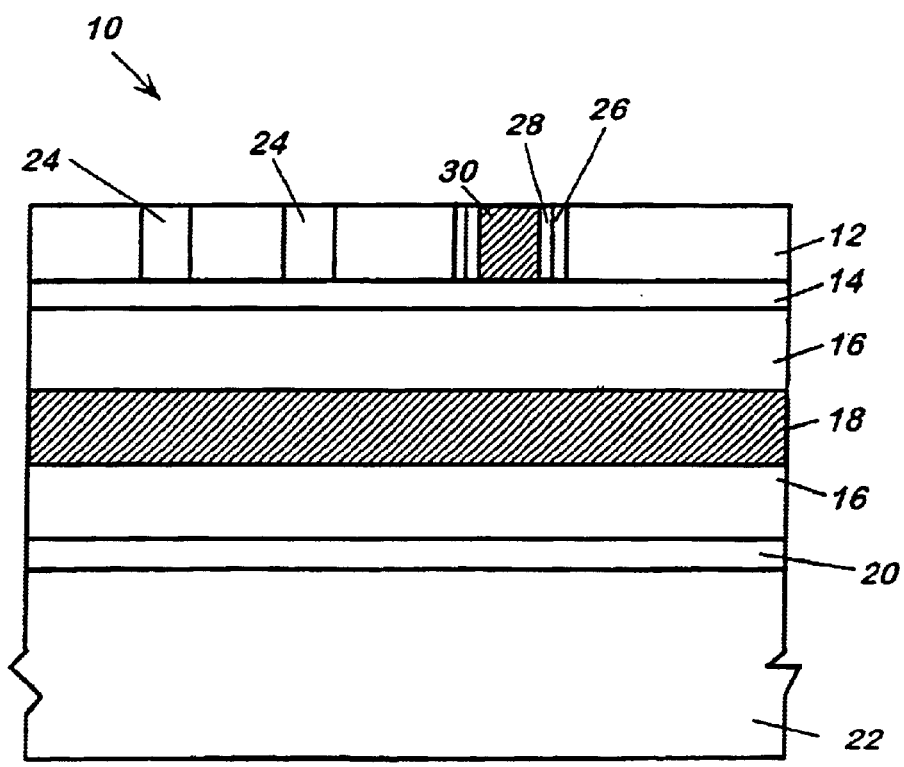
FIG. 4 illustrates a further preferred embodiment in which a plurality of isolation trenches are formed in the active semiconductor layer.

Further improvements in sensitivity can be achieved by incorporation of the neutron conversion material into isolation trenches formed in the active semiconductor device layer 12. The use of isolation trenches in semiconductor devices to create isolation regions is well known. FIG. 4 illustrates a further preferred embodiment in which a plurality of isolation trenches 24 are formed in the active semiconductor device layer 12. The sides of the trenches 24 are coated with a trench oxide 26 and a trench barrier film 28 (for example 5 to 10 nm of silicon nitride). The remaining portion of the trenches 24 are filled with the neutron conversion material (containing boron-10) to form neutron conversion trench layers 30. As with the neutron conversion layer 18, the neutron conversion trench layers 30 convert neutrons to alpha particles and lithium ions, which cause effects in electrical circuit elements formed in the active semiconductor device layer 12. It will be understood that the trenches can also be used in combination with the substrates illustrated in FIGS. 2 and 3.

Figure 5:
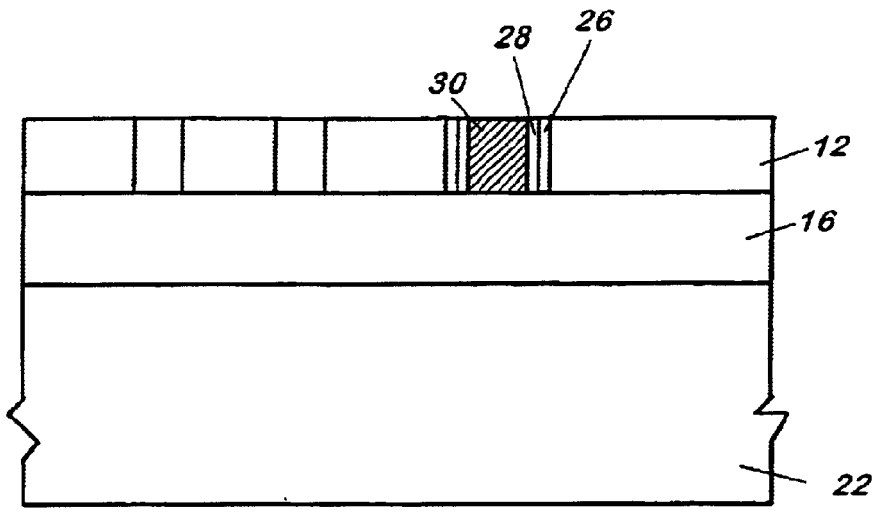
FIG. 5 illustrates an embodiment of the invention in which only neutron conversion trench layers are utilized.

It is further noted that the use of the neutron conversion trench layers 30 alone in combination with conventional SOI substrates may be sufficient for certain applications. FIG. 5 illustrates an embodiment of a neutron sensitive SOI substrate in accordance with the present invention that includes an active semiconductor device layer 12, an insulating layer 16 and a base substrate 22. As shown in FIG. 4, trenches 24 are formed in the active semiconductor device layer 12 and include the neutron conversion trench layers 30. In certain instances, the alpha particles emitted by the neutron conversion trench layers 30 alone may provide sufficient sensitivity. This embodiment is particularly easy to implement as the base substrate is a conventional SOI substrate. Accordingly, the primary modification over conventional devices is simply the inclusion of the neutron conversion trench layers 30 in the trenches 24.

Figure 6:
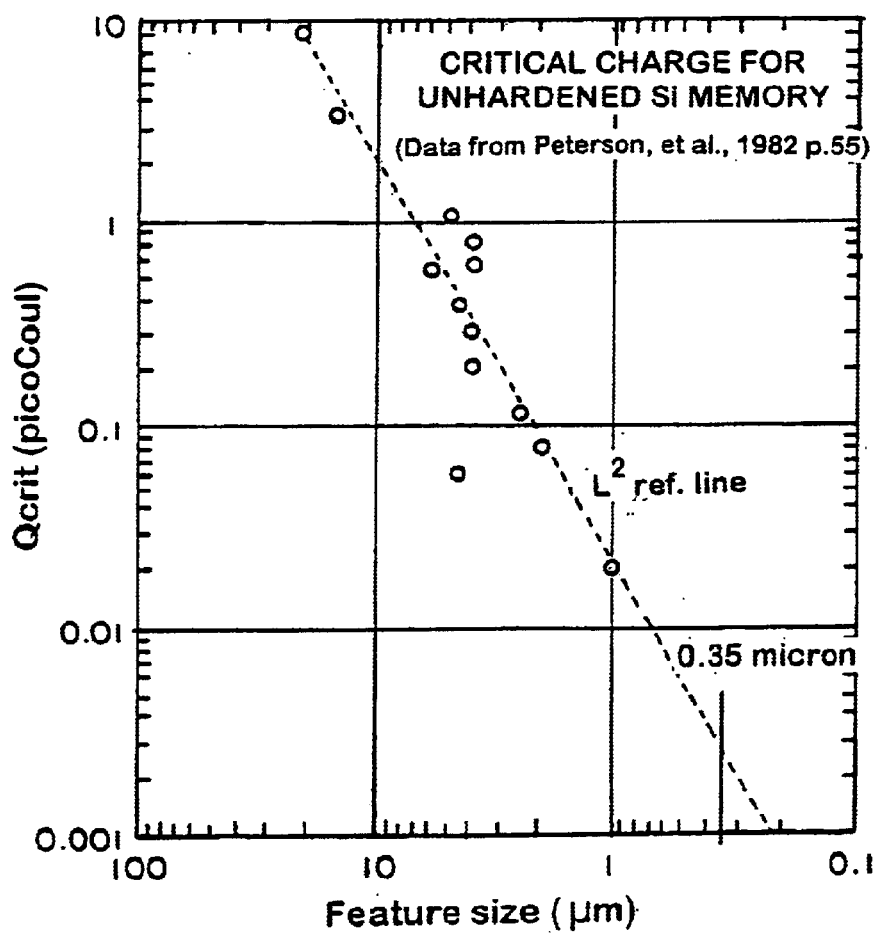
FIG. 6 is a graph illustrating the Qcrit for unhardened silicon memory cells based on feature size.

The substrates described above are particularly well suited for production of neutron sensitive static random access memories (SRAMs) to be used as neutron detectors. The susceptibility of memory devices to SEU in general has been extensively studied for many years, and has revealed an important quantity called the critical charge (Qcrit). The Qcrit is the amount of charge a memory cell must accumulate in order to produce a bit error. It has long been known that finer lithographic line widths lead to smaller cells, to smaller cell charge holding capacity, and thus to smaller Qcrit for higher density memory devices. A graph illustrating the Qcrit for unhardened silicon memory cells based on feature size is shown in FIG. 6. By locating the neutron conversion layer 18 in close proximity to the active semiconductor device layer 12 in which memory cell elements are formed, sufficient charge can be generated by the alpha particles produced by the interaction of the neutrons with the boron-10.

Figure 7:
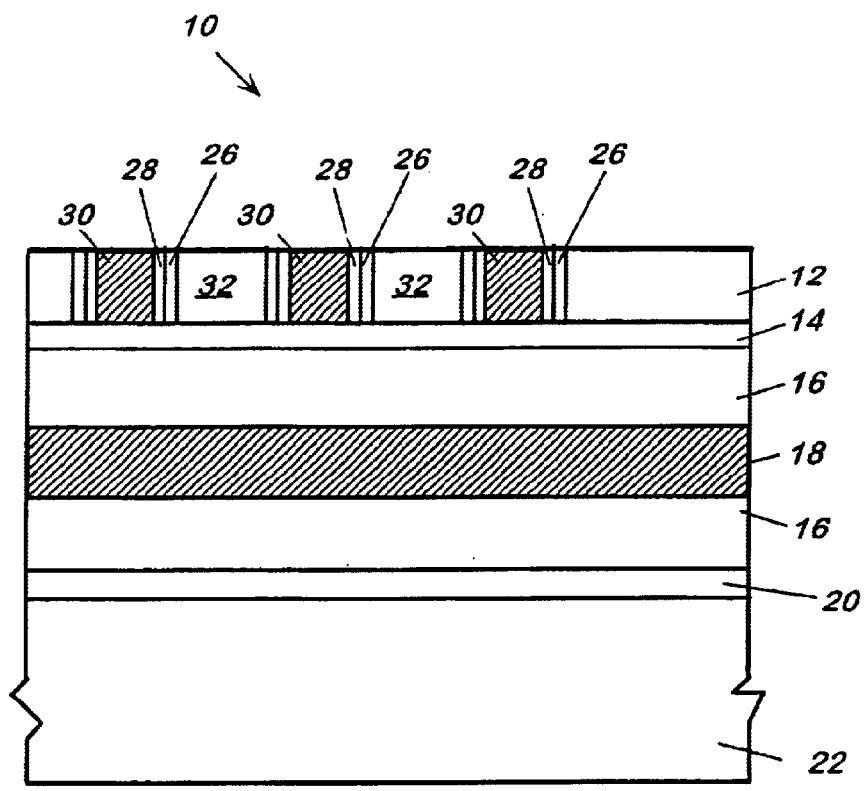
FIG. 7 illustrates an example of a device for use as a neutron detector in accordance with the invention.

FIG. 7 illustrates an example of a device for use as a neutron detector. The substrate employed in the illustrated example is the same as the substrate illustrated in FIG. 4. For the sake of simplicity of illustration, the isolated regions locations between the trenches 24 will be considered memory cell elements 32, although those skilled in the art will recognize the memory cell elements 32 include those circuit elements of an SRAM device normally formed in the active semiconductor device layer 12. Also not shown for the sake of simplicity are the multiple layers of circuit levels formed over the active semiconductor device layer 12 that are necessary to form a working device. In some conventional SRAM devices, the active semiconductor device layer 12 is only 200 nm thick. Accordingly, for purposes of illustration, the active layer will be considered to be 200 nm thick in the example illustrated in FIG. 7.

Figure 8:
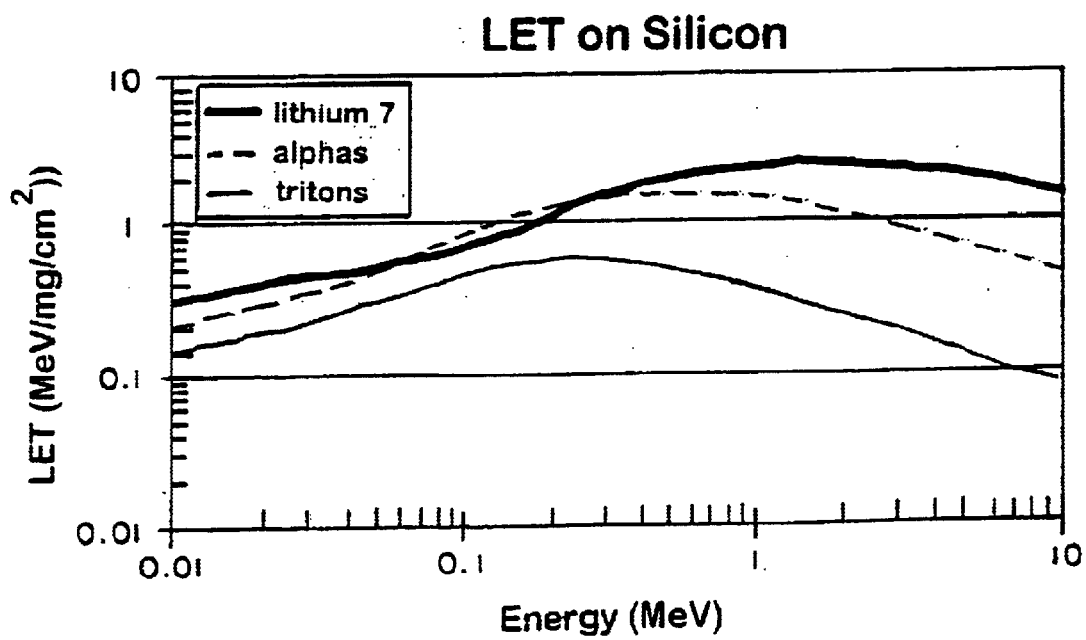
FIG. 8 is a plot of the Linear Energy Transfer (LET) of an alpha particle from boron-10 traversing silicon.

The 200 nm thickness of the typical active semiconductor device layer 12 is much less than the range of the alpha particles generated in the neutron conversion layer 18 and neutron conversion trenches 28. Only a fraction of the alpha energy will therefore be deposited in the active semiconductor device layer 12. The relevant quantity then becomes the amount of energy deposited along the track of the alpha particles, i.e., the Linear Energy Transfer (LET). The LET of an alpha particle from boron-10 traversing silicon is plotted in FIG. 8. It can be seen that the LET varies from about 1 to 1.5 Mev/(mg cm$^2$) over essentially the entire useful energy range of the alpha particle. Applying these limits to a 200 nm thickness gives a range of energy deposited in the active semiconductor device layer 12 for normal incidence (the charge will increase for non-normal incidence with greater path lengths through the active silicon layer 12). The amount of energy required (in MeV) per liberated charge (in pC) can be calculated. See "Calculation of Cosmic-Ray Induced Soft Upsets and Scaling in VLSI Devices", E. L. Peterson et al., IEEE Transactions on Nuclear Science, NS-29/6, December 1982, 2055-63, the contents of which are incorporated herein by reference. For the illustrated example, the energy is 22.5 MeV giving a value of about 2 to 3 femtocouloubs deposited in the active layer at normal incidence.

Figure 9:
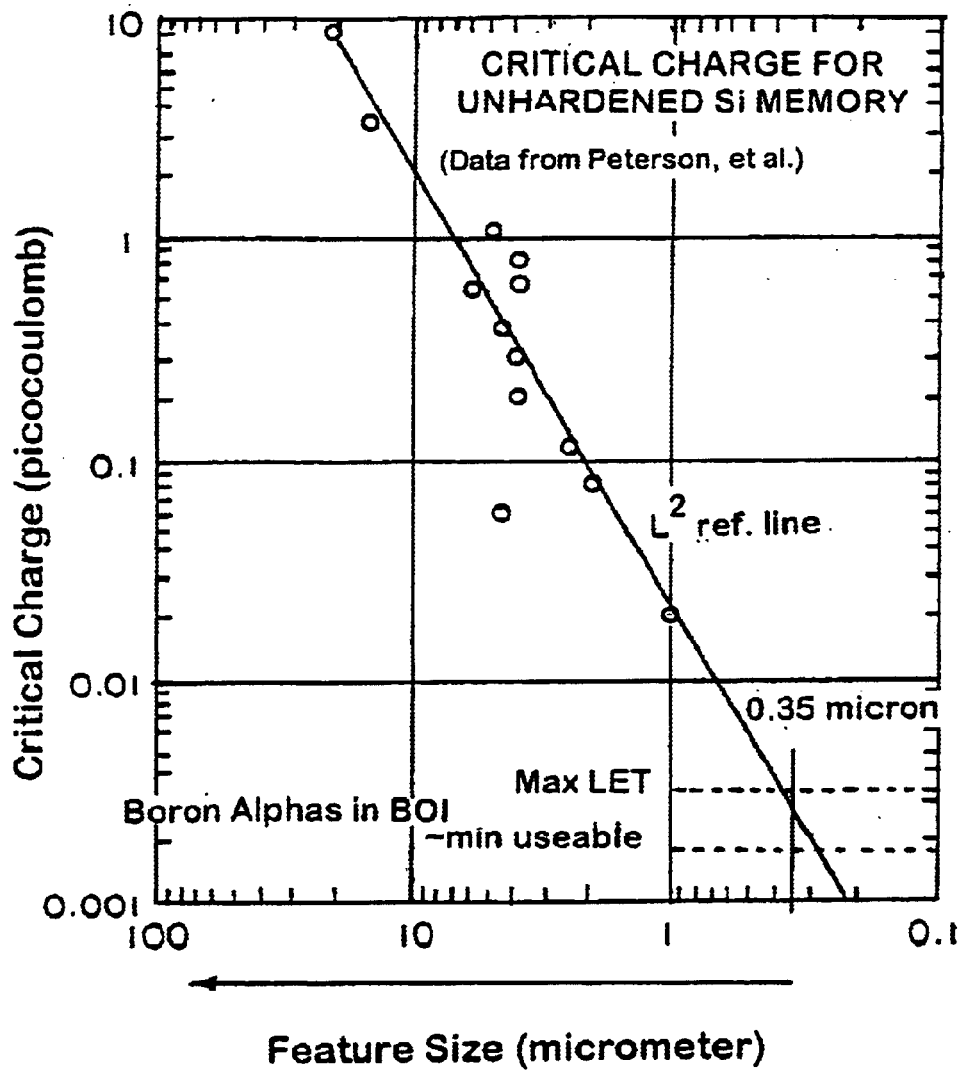
FIG. 9 is a graph including limiting values for liberating charge in the active semiconductor device layer.

FIG. 6 can now be replotted as shown in FIG. 9 to include these limiting values for liberating charge in the active semiconductor device layer. As shown in FIG. 9, the alpha particle produced will—at almost any point in its trajectory in silicon—supply an amount of charge comparable to Qcrit for a 0.35 micron line width SOI RAM cell. In other words, the proximally placed neutron conversion layer 18 will produce alpha particles sufficient to cause SEU in conventional SOI RAM structures.

A neutron detector constructed utilizing a semiconductor substrate in accordance with the present invention can be utilized in a variety of applications. Just one notable application is in the area of monitoring the transportation of cargo. The low standby current draw of a neutron detector (using SRAM technology) allows integrations of any desired duration to be performed without difficulty, as battery life can be on the order of years.

The neutron sensitive SRAM can similarly be used for mobile or tags for nuclear security concerns other than transportation. For example, a building or wide area can be instrumented with neutron sensitive SRAM sensors. Data acquisition can proceed through satcomm, as above, through a wireless network or wired telecommunications network.

The invention has been described with reference to certain preferred embodiments thereof. It will be understood, however, that modifications and variations are possible within the scope of the appended claims. For example, an additional SRAM circuit can be applied to a single-sided neutron sensitive SRAM to produce a "sandwich" sensor, wherein the center layer is the converter and SRAM circuits are provided on either side of the converter. The technology for multiple stacked layers of silicon microcircuits has already been demonstrated. See "Electrical Integrity of State-of-the-Art 0.13 µm SOI CMOS Devices and Circuits Transferred for Three-Dimensional (3D) Integrated Circuit (IC) Fabrication", K. W. Guarini et al., IEDM Technical Digest, IEEE, (2002), the contents of which are incorporated herein by reference. Further, the invention has been described with reference to silicon memory SOI circuits, however, other semiconductor device types may be used to fabricate semiconductor-on-insulator integrated circuits and then can also be neutron-sensitized with one or more proximal neutron conversion materials in accordance with the invention to make neutron detectors. Still further, the invention is not limited to static RAM type memory devices, but can also be incorporated in other types of memory devices.

What is claimed is:

1. A semiconductor substrate comprising:
   an active semiconductor device layer;
   a base substrate;
   an insulating layer provided between the active semiconductor device layer and the base substrate; and
   a neutron conversion layer provided between the active semiconductor device layer and the base substrate.

2. A semiconductor substrate as claimed in claim 1, wherein the neutron conversion layer is located within the insulating layer.

3. A semiconductor substrate as claimed in claim 2, wherein a barrier layer is provided between at least one of the neutron conversion layer and the active semiconductor device layer and the neutron conversion layer and the base substrate.

4. A semiconductor substrate as claimed in claim 2, further comprising a plurality of trenches formed in the active semiconductor device layer and a trench neutron conversion layer formed in at least one of the trenches.

5. A semiconductor substrate as claimed in claim 4, further comprising a trench insulating layer and a trench barrier layer formed between trench neutron converting layer and the active semiconductor device layer.

6. A semiconductor substrate as claimed in claim 1, wherein the neutron conversion layer is located between the insulating layer and the base substrate.

7. A semiconductor substrate as claimed in claim 6, wherein a barrier layer is provided between at least one of the neutron conversion layer and the active semiconductor device layer and the neutron conversion layer and the base substrate.

8. A semiconductor substrate as claimed in claim 6, further comprising a plurality of trenches formed in the active semiconductor device layer and a trench neutron conversion layer formed in at least one of the trenches.

9. A semiconductor substrate as claimed in claim 8, further comprising a trench insulating layer and a trench barrier layer formed between trench neutron converting layer and the active semiconductor device layer.

10. A semiconductor substrate as claimed in claim 6, further comprising a plurality of trenches formed in the active semiconductor device layer and a trench neutron conversion layer formed in at least one of the trenches.

11. A semiconductor substrate as claimed in claim 10, further comprising a trench insulating layer and a trench barrier layer formed between trench neutron converting layer and the active semiconductor device layer.

12. A semiconductor substrate as claimed in claim 1, wherein the neutron conversion layer is located between the active semiconductive device layer and the insulating layer.

13. A semiconductor substrate as claimed in claim 12, wherein a barrier layer is provided between at least one of the neutron conversion layer and the active semiconductor device layer and the neutron conversion layer and the base substrate.

14. A semiconductor substrate as claimed in claim 1, further comprising a plurality of trenches formed in the active semiconductor device layer and a trench neutron conversion layer formed in at least one of the trenches.

15. A semiconductor substrate as claimed in claim 14, further comprising a trench insulating layer and a trench barrier layer formed between trench neutron converting layer and the active semiconductor device layer.

16. A semiconductor substrate as claimed in claim 1, wherein the neutron conversion layer includes boron-10.

17. A semiconductor substrate as claimed in claim 16, further comprising a trench insulating layer and a barrier layer formed between the trench neutron conversion layer and the active semiconductor layer.

18. A semiconductor substrate comprising:
    an active semiconductor layer;
    a base substrate;
    an insulating layer formed between the active semiconductor layer and the base substrate;
    a plurality of isolation trenches formed in the active semiconductor layer; and
    a trench neutron conversion layer formed in at least one of the trenches.

19. A semiconductor substrate as claimed in claim 18, wherein the trench neutron conversion layer comprises boron-10.

20. A method of manufacturing a semiconductor substrate comprising:
    forming an active semiconductor device layer on a base substrate;
    forming an insulating layer between the active semiconductor device layer and the base substrate; and
    forming a neutron conversion layer between the active semiconductor device layer and the bas substrate.

* * * * *